(12) United States Patent
Nam et al.

(10) Patent No.: US 7,122,850 B2
(45) Date of Patent: Oct. 17, 2006

(54) SEMICONDUCTOR DEVICE HAVING LOCAL INTERCONNECTION LAYER AND ETCH STOPPER PATTERN FOR PREVENTING LEAKAGE OF CURRENT

(75) Inventors: Dong-kyun Nam, Yongin (KR);
Heon-jong Shin, Yongin (KR);
Hyung-tae Ji, Pusan (KR)

(73) Assignee: Samsung Electronics Co., Ltd., (KR)

( * ) Notice: Subject to any disclaimer, the term of this patent is extended or adjusted under 35 U.S.C. 154(b) by 296 days.

(21) Appl. No.: 10/231,514

(22) Filed: Aug. 30, 2002

(65) Prior Publication Data

US 2003/0049936 A1    Mar. 13, 2003

(30) Foreign Application Priority Data

Sep. 7, 2001    (KR) ................. 2001-55064

(51) Int. Cl.
*H01L 23/58*    (2006.01)
*H01L 23/64*    (2006.01)
*H01L 27/115*    (2006.01)
*H01L 29/76*    (2006.01)
*H01L 27/108*    (2006.01)

(52) U.S. Cl. .............. 257/295; 257/E27.104; 257/E27.112; 257/E23.15; 257/E27.101; 257/758; 257/382; 257/242; 257/347; 257/40; 257/99; 257/288; 257/508; 257/384; 257/408

(58) Field of Classification Search ........... 257/382, 257/242, 40, 99, 410, 411, 408, 396, 510, 257/292, 508, 501, 288, 384, 213, 758, 295, 257/E27.112, E27.104, E23.15, E27.101
See application file for complete search history.

(56) References Cited

U.S. PATENT DOCUMENTS

| | | | | |
|---|---|---|---|---|
| 5,536,683 A | * | 7/1996 | Lin et al. .............. | 438/639 |
| 5,677,231 A | | 10/1997 | Maniar et al. .......... | 437/67 |
| 5,981,331 A | * | 11/1999 | Tsunemine ............ | 438/240 |
| 6,046,103 A | | 4/2000 | Thei et al. ............. | 438/624 |
| 6,080,616 A | * | 6/2000 | Kim .................. | 438/239 |
| 6,133,105 A | | 10/2000 | Chen et al. ............ | 438/296 |
| 6,180,532 B1 | | 1/2001 | Yang et al. ............ | 438/710 |
| 6,204,106 B1 | * | 3/2001 | Gonzalez .............. | 438/238 |
| 6,207,539 B1 | * | 3/2001 | Natsume ............... | 438/533 |
| 6,207,543 B1 | | 3/2001 | Harvey et al. .......... | 438/586 |
| 6,222,254 B1 | * | 4/2001 | Liang et al. ........... | 257/622 |
| 6,249,014 B1 | * | 6/2001 | Bailey ................ | 257/295 |

(Continued)

FOREIGN PATENT DOCUMENTS

KR    00-0040447    5/2000

*Primary Examiner*—Alexander Oscar Williams
(74) *Attorney, Agent, or Firm*—Mills & Onello LLP (57) ABSTRACT

A semiconductor device having a local interconnection layer and a method for manufacturing the same are provided. A local interconnection layer is formed in an interlayer dielectric (ILD) layer on an isolation layer and a junction layer, for covering a semiconductor substrate, the isolation layer, and a gate pattern. An etch stopper pattern having at least one layer for preventing the etching of the isolation layer is formed under the local interconnection layer. The etch stopper pattern having at least one layer for preventing the etching of the isolation layer can be included when forming the local interconnection layer, thereby preventing leakage current caused by the etching of the isolation layer, improving the electrical characteristics of a semiconductor device, and improving the yield of a process of manufacturing a semiconductor device.

9 Claims, 8 Drawing Sheets

U.S. PATENT DOCUMENTS

| | | | |
|---|---|---|---|
| 6,251,724 B1 * | 6/2001 | Ku et al. | 438/253 |
| 6,300,229 B1 * | 10/2001 | Tanaka et al. | 438/584 |
| 6,313,510 B1 * | 11/2001 | Kim et al. | 257/382 |
| 6,335,249 B1 * | 1/2002 | Thei et al. | 438/296 |
| 6,344,692 B1 * | 2/2002 | Ikemasu et al. | 257/758 |
| 6,352,903 B1 * | 3/2002 | Rovedo et al. | 438/387 |
| 6,486,077 B1 * | 11/2002 | Sato | 438/763 |
| 6,498,088 B1 * | 12/2002 | Trivedi | 438/618 |
| 6,531,724 B1 * | 3/2003 | Furukawa et al. | 257/288 |
| 6,551,901 B1 * | 4/2003 | Gu et al. | 438/424 |
| 6,555,892 B1 * | 4/2003 | Horstmann et al. | 257/508 |
| 6,597,055 B1 * | 7/2003 | Liaw | 257/529 |
| 6,613,645 B1 * | 9/2003 | Fukaura | 438/424 |
| 6,649,490 B1 * | 11/2003 | Lee et al. | 438/445 |
| 6,710,413 B1 * | 3/2004 | Thei et al. | 257/382 |
| 6,735,108 B1 * | 5/2004 | Kurth et al. | 365/149 |
| 6,781,867 B1 * | 8/2004 | Kurth et al. | 365/149 |
| 6,791,131 B1 * | 9/2004 | Fazan et al. | 257/296 |
| 6,818,489 B1 * | 11/2004 | Kim et al. | 438/197 |
| 2001/0001075 A1 * | 5/2001 | Ngo et al. | 438/257 |
| 2001/0010961 A1 | 8/2001 | Jung et al. | 438/279 |
| 2002/0053694 A1 * | 5/2002 | Sutcliffe | 257/326 |
| 2002/0058402 A1 * | 5/2002 | Wieczorek et al. | 438/586 |
| 2002/0132191 A1 * | 9/2002 | Chuang | 430/314 |
| 2002/0158272 A1 * | 10/2002 | Natsume | 257/206 |
| 2003/0113973 A1 * | 6/2003 | Chu | 438/296 |
| 2003/0124845 A1 * | 7/2003 | Trivedi | 438/682 |
| 2005/0037569 A1 * | 2/2005 | Itoh | 438/253 |

* cited by examiner

SEMICONDUCTOR DEVICE HAVING LOCAL INTERCONNECTION LAYER AND ETCH STOPPER PATTERN FOR PREVENTING LEAKAGE OF CURRENT

BACKGROUND OF THE INVENTION

1. Field of the Invention

The present invention relates to a semiconductor device and a method for manufacturing the same, and more particularly, to a semiconductor device having a local interconnection layer and a method for manufacturing the same.

2. Description of the Related Art

As the size of electronic products such as mobile phones, video tape recorders (VTRs), and notebooks becomes smaller, the size of the semiconductor devices used in those electronic products also becomes smaller. As a result, in a process of manufacturing the semiconductor devices, the design rule used to control the size of the devices also becomes smaller.

In order to improve the electrical performance of a semiconductor device, a shallow junction is used as a source/drain region.

Figure 1:
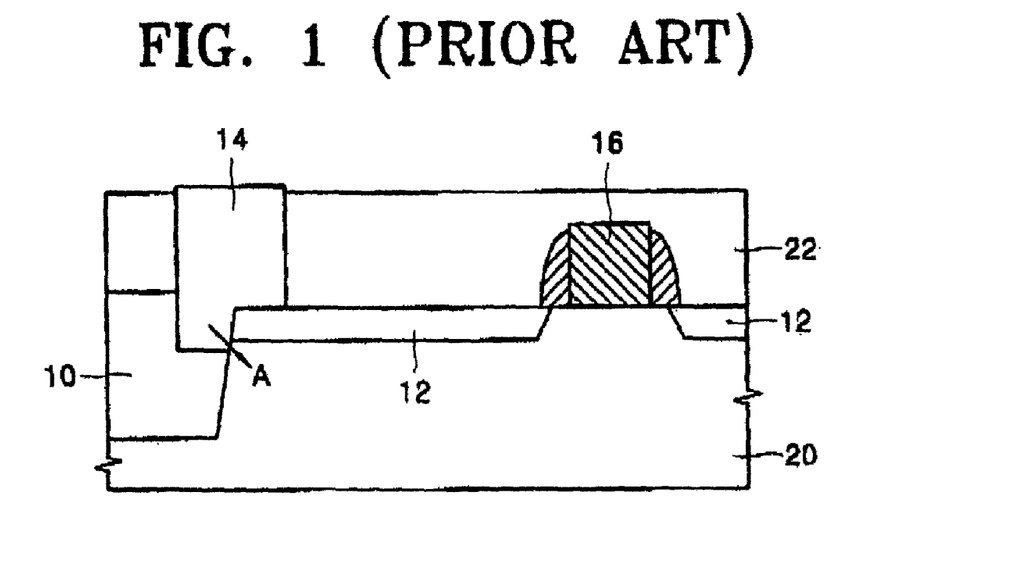
FIG. 1 is a sectional view of a semiconductor device having a conventional local interconnection layer.

FIG. 1 is a sectional view of a semiconductor device having a conventional local interconnection layer. Referring to FIG. 1, an isolation layer 10, for example, a trench isolation layer, is formed in a semiconductor substrate 20. Subsequently, a gate pattern 16 is formed by a conventional method on an active region of the semiconductor substrate 20, which is defined by the isolation layer 10. Next, impurity ions are implanted into the semiconductor substrate 20, thereby forming a junction layer 12 on the semiconductor substrate 20 at both sides of the gate pattern 16. In general, the junction layer 12 is a shallow junction layer. Subsequently, an interlayer dielectric (ILD) layer 22 is formed to be thick on the entire surface of the semiconductor substrate 20 on which the junction layer 12 is formed and on the isolation layer 10. Then, part of the ILD layer 22 is etched to form a contact hole. Finally, a local interconnection layer 14 is formed filling the contact hole.

However, according to a conventional method for manufacturing a semiconductor device, the isolation layer 10 is etched when forming the local interconnection layer 14. The isolation layer 10 is etched to be deeper than the junction layer 12. In such a case, leakage current occurs in a direction A shown in FIG. 1, resulting in lowering the electrical characteristics of the semiconductor device.

The reason the isolation layer 10 is etched to be deeper than the junction layer 12 is as follows. First, the junction layer 12 becomes thinner while a semiconductor device is formed. The contact hole for forming the local interconnection layer 14 is formed by a dry etch process. However, it is very difficult to form the contact hole having a depth shallower than the junction layer 12 by finely adjusting the etch selectivity. Thus, the isolation layer 10 is etched to be deeper than the junction layer 12.

The electrical performance of a semiconductor device is lowered by the leakage current, and leakage current is a factor that lowers the yield of a process of manufacturing a semiconductor device.

SUMMARY OF THE INVENTION

To solve the above problems, it is a first objective of the present invention to provide a semiconductor device which is capable of preventing leakage current caused by etching an isolation layer, improving the electrical characteristics of a semiconductor device, and improving the yield of a process of manufacturing a semiconductor device It is a second objective of the present invention to provide a method for manufacturing a semiconductor device which is capable of preventing leakage current caused by etching the isolation layer, improving the electrical characteristics of a semiconductor device, and improving the yield of a process of manufacturing a semiconductor device.

In accordance with the invention, there is provided a semiconductor device having a local interconnection layer. The semiconductor device includes an isolation layer, a junction layer, an interlayer dielectric (ILD) layer, a local interconnection layer, and an etch stopper pattern. The isolation layer defines an active region of a semiconductor substrate at both sides of a gate pattern. The junction layer is formed on the semiconductor substrate at both sides of the gate pattern. The interlayer dielectric (ILD) layer covers the semiconductor substrate, the isolation layer, and the gate pattern. The local interconnection layer is formed in the ILD layer on the isolation layer and the junction layer. The etch stopper pattern has at least one layer that prevents the etching of the isolation layer under the local interconnection layer.

In accordance with another aspect of the invention, there is provided a method for manufacturing a semiconductor device having a local interconnection layer. Impurity ions are implanted into a semiconductor substrate, on which an isolation layer and a gate pattern are formed, and a junction layer is formed on the semiconductor substrate. An etch stopper having at least one layer on the isolation layer and the junction layer is etched, and an etch stopper pattern for preventing the etching of the isolation layer is formed. An interlayer dielectric (ILD) layer on the junction layer, the gate pattern, and the etch stopper are etched, and a contact hole on which a local interconnection layer is to be formed is formed. The local interconnection layer is formed by filling the contact hole with a conductive material.

In the semiconductor device having a local interconnection layer according to the present invention and the method for manufacturing the same, leakage current caused by etching the isolation layer can be prevented, thereby improving the electrical characteristics of a semiconductor device and improving the yield of a process of manufacturing a semiconductor device.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

The present invention will be described more fully hereinafter with reference to the accompanying drawings in which preferred embodiments of the invention are shown. In the drawings, the forms of elements are exaggerated for clarity. It will be understood that when a layer is referred to as being on another layer or on a semiconductor substrate, it can be directly on the other layer or on the semiconductor substrate, or intervening layers may also be present.

Figure 2:
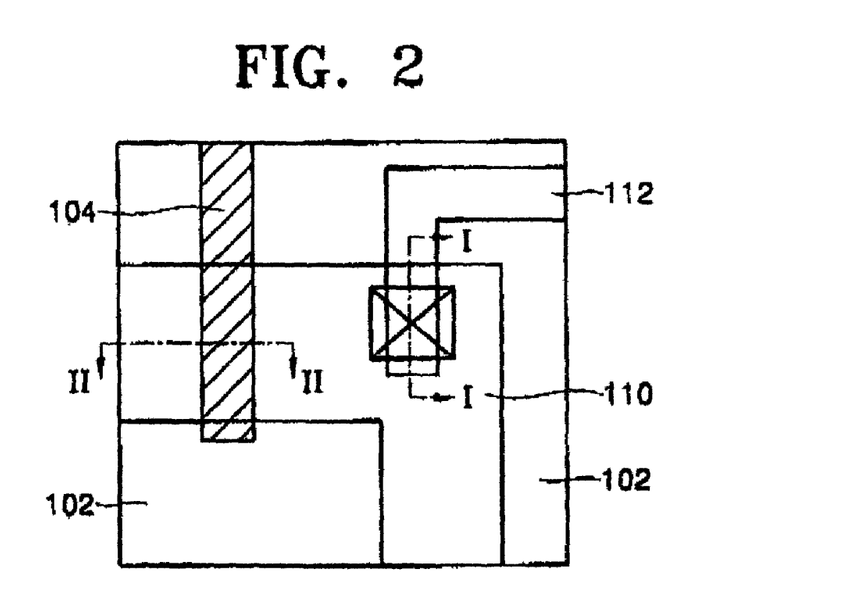
FIG. 2 is a plan view of a semiconductor device having a local interconnection layer according to the present invention.

FIG. 2 is a plan view of a semiconductor device having a local interconnection layer according to the present invention. Referring to FIG. 2, a gate pattern 104 is formed on an active region of a semiconductor substrate (100 of FIG. 3), which is defined by an isolation layer 102, for example, a trench isolation layer. Next, impurity ions are implanted into the semiconductor substrate 100, thereby forming a junction layer 110 on the semiconductor substrate 100 at both sides of the gate pattern 104. In general, the junction layer 110 is a shallow junction layer. A local interconnection region 112 is formed on the junction layer 110 and on the isolation layer 102. Here, I—I and II—II denote cut lines to be described later.

FIGS. 3 through 7 are sectional views illustrating a semiconductor device having a local interconnection layer according to a first embodiment of the present invention and a method for manufacturing the same. Hereinafter, the local interconnection region 112 is referred to as a local interconnection layer 112. The local interconnection layer 112 will be described with reference to FIG. 2 taken along line I—I, and the gate pattern 104 will be described with reference to FIG. 2 taken along line II—II.

Figure 3:
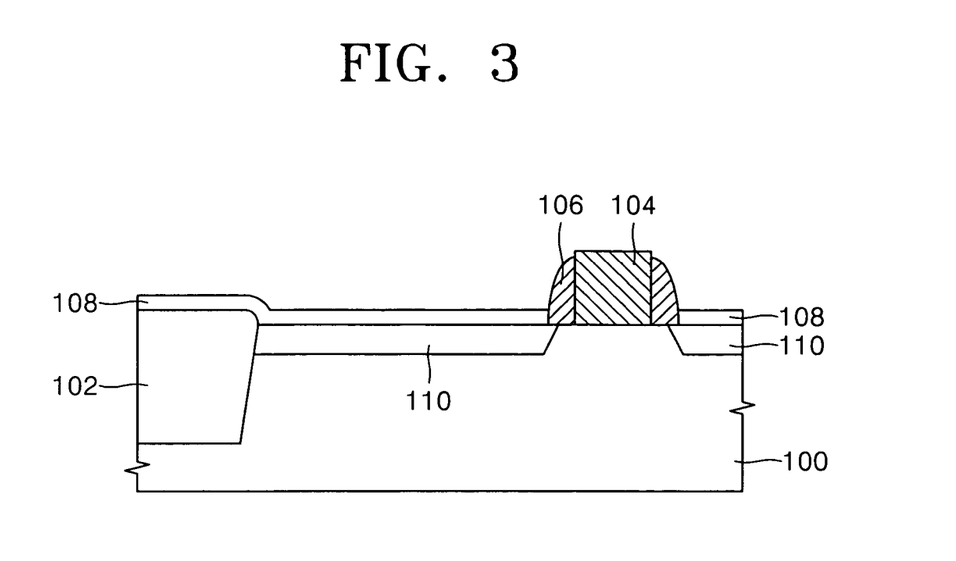
FIGS. 3 through 16 are sectional views illustrating a semiconductor device having a local interconnection layer according to first through fourth embodiments of the present invention and a method for manufacturing the same.

Referring to FIG. 3, impurity ions are implanted into the semiconductor substrate 100 on which the isolation layer 102 and the gate pattern 104 are formed, thereby forming the junction layer 110. Specifically, impurity ions for forming the junction layer 110 are implanted into the semiconductor substrate 100 on which the isolation layer 102 and the gate pattern 104 are formed, by using the gate pattern 104 as an ion implantation mask. Impurity ions are implanted at a dose of $1-9\times10^{14}$ atoms/cm$^2$ and with an energy of about 10 KeV. After performing this process, the junction layer 110 is formed on the semiconductor substrate 100 at both sides of the gate pattern 104.

A spacer 106 is formed on sidewalls of the gate pattern 104. Next, a source/drain region (not shown) having a deep junction layer is formed using the gate pattern 104 including the spacer 106 as an impurity ion implantation mask. As occasion demands, a thermal treatment process can be performed after the junction layer 110 is formed or after a source/drain region (not shown) is formed.

A first etch stopper 108 is formed on the isolation layer 102 and the junction layer 110. Preferably, the first etch stopper 108 is formed of silicon nitride (Si$_3$N$_4$), and the thickness of silicon nitride (Si$_3$N$_4$) is 300–700 Å.

Figure 4:
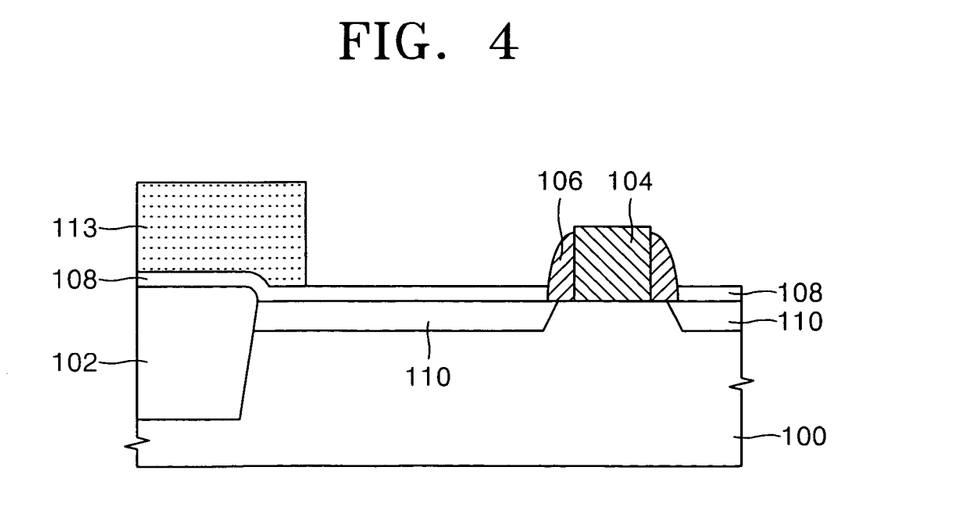

Referring to FIG. 4, a first photoresist pattern 113 for covering the isolation layer 102 and part of the junction layer 110 is formed on the first etch stopper 108.

Figure 5:
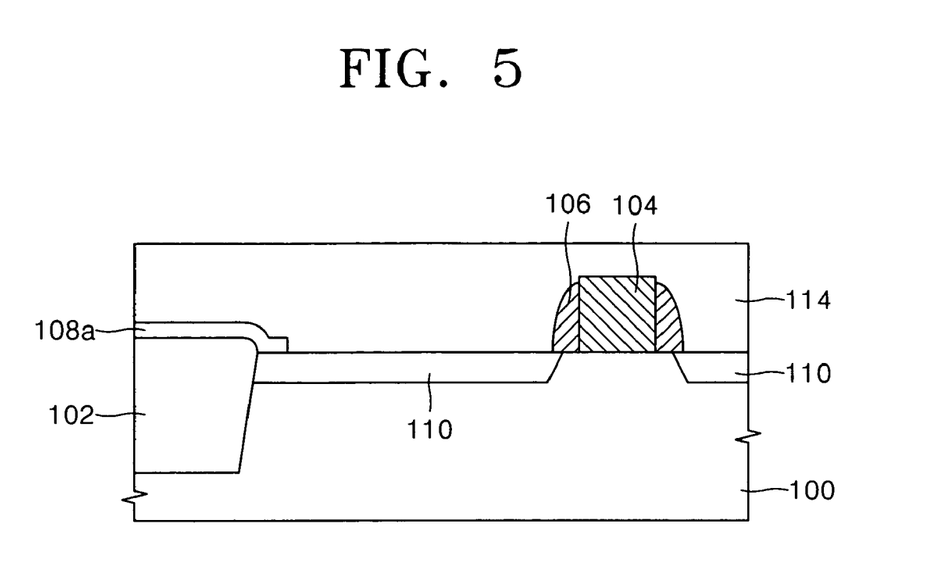

Referring to FIG. 5, the first etch stopper 108 is etched using the first photoresist pattern 112 as an etching mask, thereby forming a first etch stopper pattern 108a for exposing the junction layer 110. The etching time for etching the first etch stopper 108 can be adjusted so that the thickness of the first etch stopper 108 can be considered with respect to the etching rate of the etchant.

The isolation layer 102 and part of the junction layer 110 are covered by the first etch stopper pattern 108a. Specifically, preferably, the first etch stopper pattern 108a of the junction layer 110 is formed on a region that extends 0.05–0.3 μm from the end of the isolation layer 102 toward the junction layer 110. Even though part of the junction layer 110 is covered by the first etch stopper pattern 108a, the first etch stopper pattern 108a prevents the etching of the isolation layer 102. The first etch stopper pattern 108a can be formed by covering part of the junction layer 110. Subsequently, an interlayer dielectric (ILD) layer 114 is formed on the junction layer 110, the gate pattern 104, and the first etch stopper pattern 108a.

Figure 6:
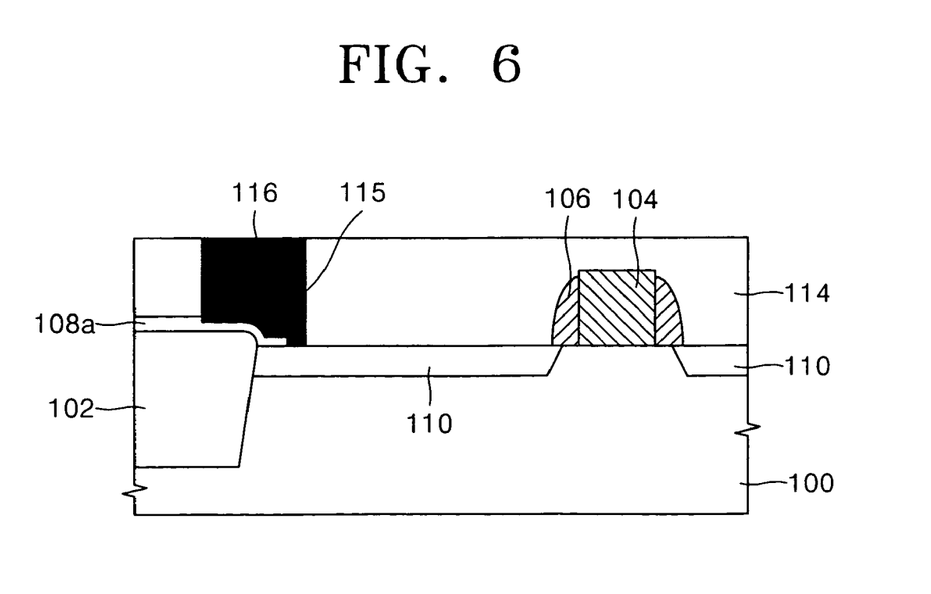

Referring to FIG. 6, the ILD layer 114 is etched to form a contact hole 115 in which a local interconnection layer 116 is to be formed. When forming the local interconnection layer 116, part of the first etch stopper 108a is not removed, instead, it is left to serve as an etch stopper to prevent the etching of the isolation layer 102. Thus, leakage current (A of FIG. 1) flowing from the local interconnection layer 116 to the semiconductor substrate 100 can be prevented.

The local interconnection layer 116 is formed of a conductive material filling the contact hole 115. Next, the conductive material on the surface of the ILD layer 114 is removed by performing a chemical mechanical polishing (CMP) process, leaving the local interconnection layer 116 formed in the contact hole 115.

According to the first embodiment, the first etch stopper pattern 108a may remain on the isolation layer 102 on which the local interconnection layer 116 is not formed. As described above, even though the first etch stopper pattern 108a remains on the isolation layer 102, the first etch stopper pattern 108a does not affect the characteristics of a semiconductor device. Further, a remaining layer or pattern is not removed, thereby reducing the time for the manufacturing process and more stably forming a semiconductor device.

FIGS. 7 through 10 are sectional views illustrating a semiconductor device having a local interconnection layer according to a second embodiment of the present invention and a method for manufacturing the same.

Figure 7:
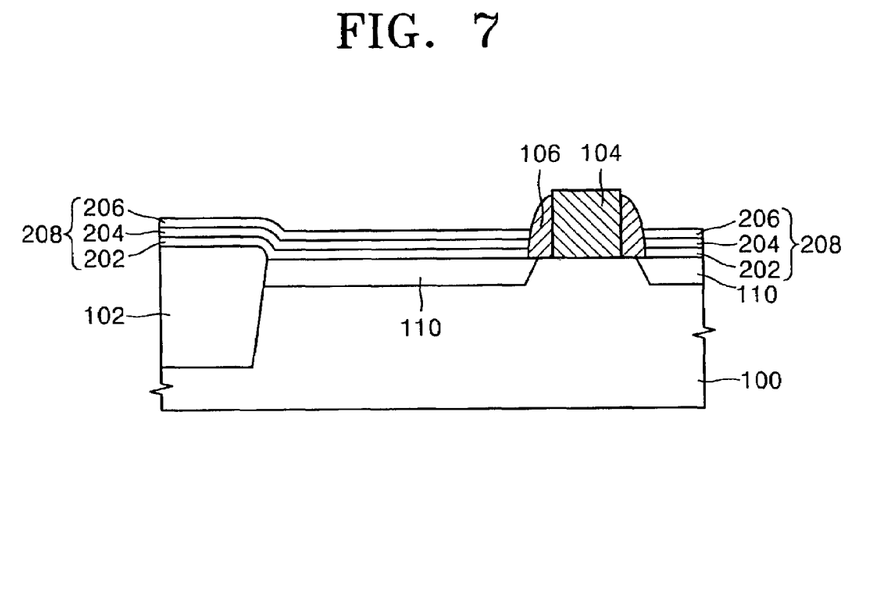

A second etch stopper 208 comprised of a first silicon nitride (Si$_3$N$_4$) layer 202, a silicon oxide (SiO$_2$) layer 204, and a second silicon nitride (Si$_3$N$_4$) layer 206 is formed on the isolation layer 102 and the junction layer 110, which are formed according to the same method as that of FIG. 3. Preferably, the thickness of the first and second silicon nitride (Si$_3$N$_4$) layers 202 and 204 is 300–700 Å.

Figure 8:
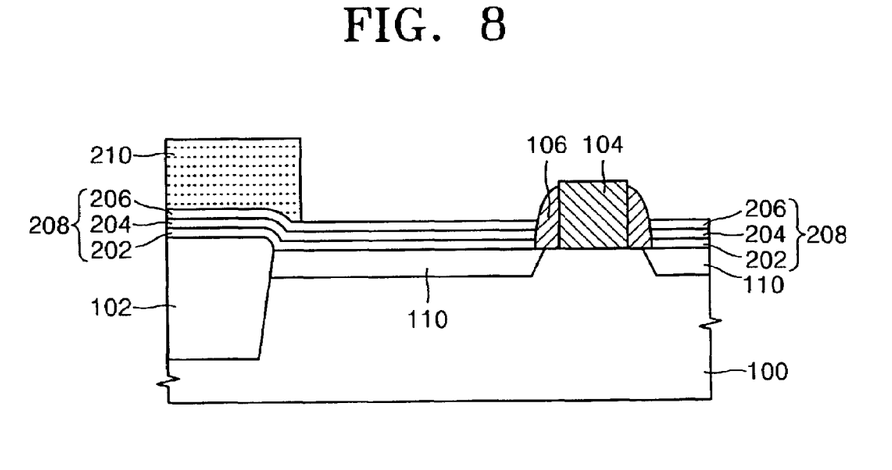

Referring to FIG. 8, a second photoresist pattern 210 for covering the isolation layer 102 and part of the junction layer 110 is formed on the second etch stopper 208.

Figure 9:
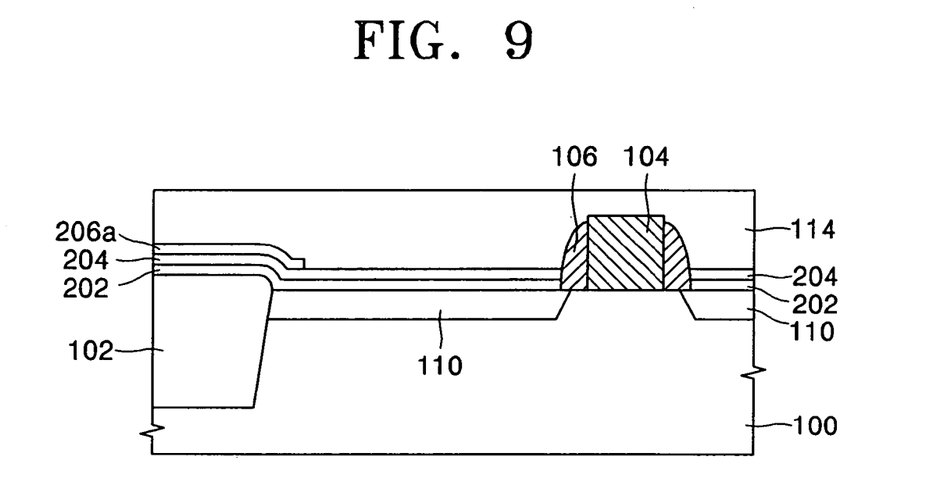

Referring to FIG. 9, the second silicon nitride (Si$_3$N$_4$) layer 206 is etched using the second photoresist pattern 210 as an etching mask, thereby forming a second silicon nitride (Si$_3$N$_4$) layer pattern 206a for exposing the silicon oxide (SiO$_2$) layer 204. The reason the second silicon nitride (Si$_3$N$_4$) layer 206 is selectively etched is that the silicon oxide (SiO$_2$) layer 204 is used in forming a local interconnection layer (116 of FIG. 10) in a subsequent process.

The isolation layer 102 and part of the junction layer 110 are covered by the second silicon nitride (Si$_3$N$_4$) layer pattern 206a. Specifically, preferably, the second silicon nitride (Si$_3$N$_4$) layer pattern 206a over the junction layer 110 is formed on a region that extends 0.05–0.3 μm from the end of the isolation layer 102 toward the junction layer 110. Even though part of the junction layer 110 is covered by the second silicon nitride (Si$_3$N$_4$) layer 206a, the second silicon nitride (Si$_3$N$_4$) layer pattern 206a prevents the etching of the isolation layer 102. The second silicon nitride (Si$_3$N$_4$) layer pattern 206a can be easily formed by covering part of the junction layer 110. Subsequently, an interlayer dielectric (ILD) layer 114 is formed on the second silicon nitride (Si$_3$N$_4$) layer pattern 206a, the silicon oxide (SiO$_2$) layer 204, and the gate pattern 104.

Figure 10:
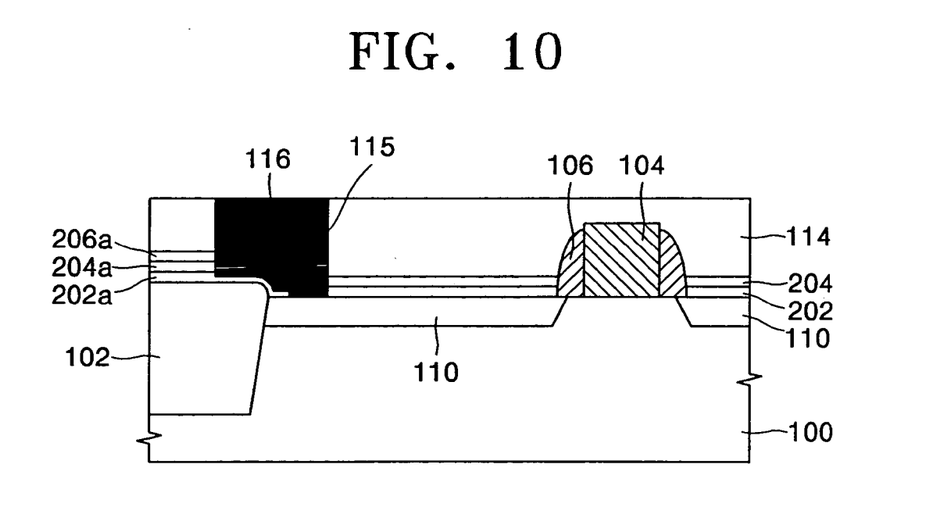

Referring to FIG. 10, the ILD layer 114 is etched to form a contact hole 115 in which a local interconnection layer 116 is to be formed. The second silicon nitride (Si$_3$N$_4$) layer pattern 206a, the silicon oxide (SiO$_2$) layer 204, and the first silicon nitride (Si$_3$N$_4$) layer 202 are etched to form the contact hole 115. The etching rate is adjusted by the silicon oxide (SiO$_2$) layer 204 that is formed between the second silicon nitride (Si$_3$N$_4$) layer pattern 206a and the first silicon nitride (Si$_3$N$_4$) layer 202. Part of the first silicon nitride (Si$_3$N$_4$) layer 202 is not removed, instead, it is left to serve as an etch stopper to prevent the etching of the isolation layer 102. That is, a first silicon nitride (Si$_3$N$_4$) layer pattern 202a for exposing the junction layer 110 is formed using the second silicon nitride (Si$_3$N$_4$) layer pattern 206a as an etching mask.

When forming the local interconnection layer 116, the first silicon nitride (Si$_3$N$_4$) layer pattern 202a prevents the isolation layer 102 from being etched. Thus, leakage current (A of FIG. 1) flowing from the local interconnection layer 116 to the semiconductor substrate 100 can be prevented.

The local interconnection layer 116 is formed to fill the contact hole 115 with a conductive material. Next, the conductive material on the surface of the ILD layer 114 is removed by performing a chemical mechanical polishing (CMP) process, leaving the local interconnection layer 116 formed in the contact hole 115.

According to the second embodiment, the first silicon nitride (Si$_3$N$_4$) layer 202 and the silicon oxide (SiO$_2$) layer 204 may remain on the junction layer 110 on which the local interconnection layer 116 is not formed. The first silicon nitride (Si$_3$N$_4$) layer pattern 202a, a silicon oxide (SiO$_2$) layer pattern 204a, and the second silicon nitride (Si$_3$N$_4$) layer pattern 206a may remain on the isolation layer 102 on which the local interconnection layer 116 is not formed. As described above, even though the first silicon nitride (Si$_3$N$_4$) layer pattern 202a, the silicon oxide (SiO$_2$) layer pattern 204a, and the second silicon nitride (Si$_3$N$_4$) layer pattern 206a remain on the isolation layer 102, the first silicon nitride (Si$_3$N$_4$) layer pattern 202a, the silicon oxide (SiO$_2$) layer pattern 204a, and the second silicon nitride (Si$_3$N$_4$) layer pattern 206a do not affect the characteristics of a semiconductor device. Further, a remaining layer or pattern is not removed, thereby reducing the time for the manufacturing process and more stably forming a semiconductor device.

Figure 11:
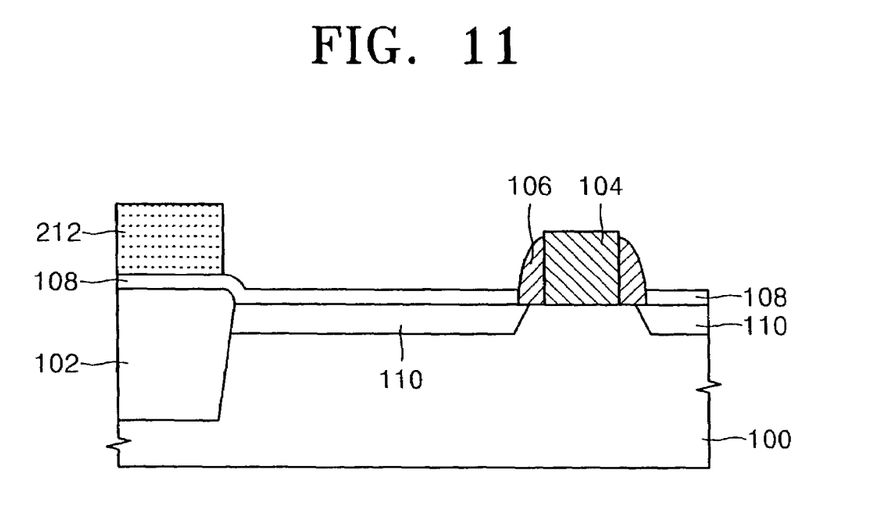
Figure 12:
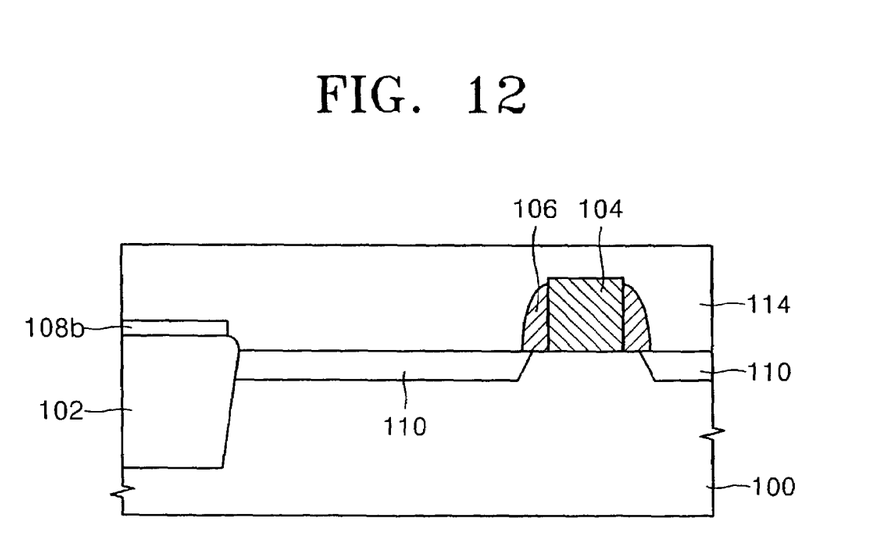
Figure 13:
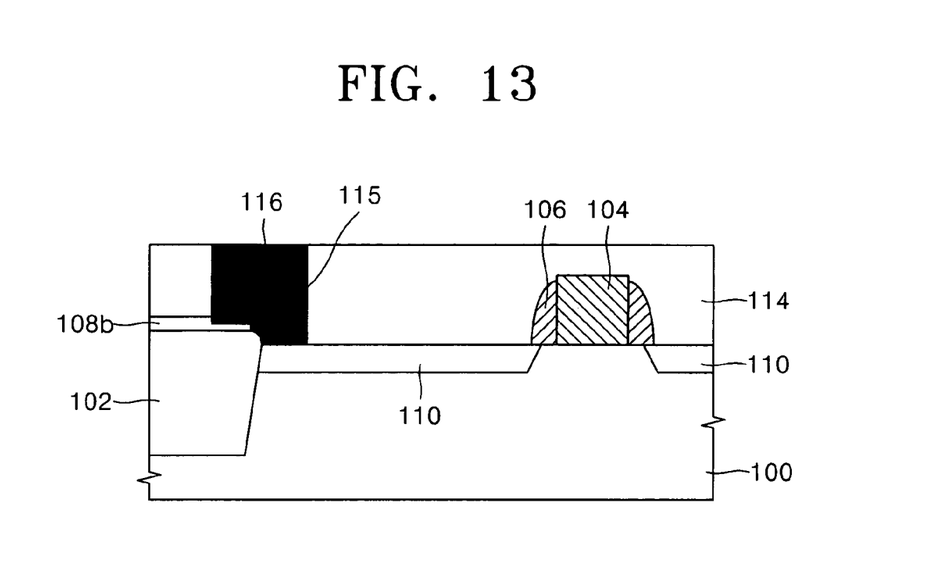

FIGS. 11 through 13 are sectional views illustrating a semiconductor device having a local interconnection layer according to a third embodiment of the present invention and a method for manufacturing the same.

Referring to FIG. 11, a third photoresist pattern 212 for covering part of the isolation layer 102 is formed on the first etch stopper 108, which is formed according to the same method as that of FIG. 3.

Referring to FIG. 12, the first etch stopper 108 is etched using the third photoresist pattern 212 as an etching mask, thereby forming a first etch stopper pattern 108a for exposing the junction layer 110. The etching time for etching the first etch stopper 108 can be adjusted so that the thickness of the first etch stopper 108 can be considered with respect to the etching rate of an etchant.

Part of the isolation layer 102 is exposed by the first etch stopper pattern 108a. Specifically, preferably, the first etch stopper pattern 108a is formed on a region that extends 0.05–0.3 µm from the end of the junction layer 110 to the inside of the isolation layer 102. This is how etching of the isolation layer 102 can be prevented and the first etch stopper pattern 108a can be readily formed even though part of the isolation layer 102 is exposed by the first etch stopper pattern 108a. Subsequently, an interlayer dielectric (ILD) layer 114 is formed on the junction layer 110, the gate pattern 104, and the first etch stopper pattern 108a.

Referring to FIG. 13, the ILD layer 114 is etched to form a contact hole 115 in which a local interconnection layer 116 is to be formed. When forming the local interconnection layer 116, the first etch stopper pattern 108a prevents the isolation layer 102 from being etched. Thus, leakage current (A of FIG. 1) flowing from the local interconnection layer 116 to the semiconductor substrate 100 can be prevented.

The local interconnection layer 116 is formed of a conductive material filling the contact hole 115. Next, the conductive material on the surface of the ILD layer 114 is removed by performing a chemical mechanical polishing (CMP) process, leaving the local interconnection layer 116 formed in the contact hole 115.

According to the third embodiment, the first etch stopper pattern 108a may remain on the isolation layer 102 on which the local interconnection layer 116 is not formed. As described above, even though the first etch stopper pattern 108a remains on the isolation layer 102, the first etch stopper pattern 108a does not affect the characteristics of a semiconductor device. Further, a remaining layer or pattern is not removed, thereby reducing the time for the manufacturing process and more stably forming a semiconductor device.

Figure 14:
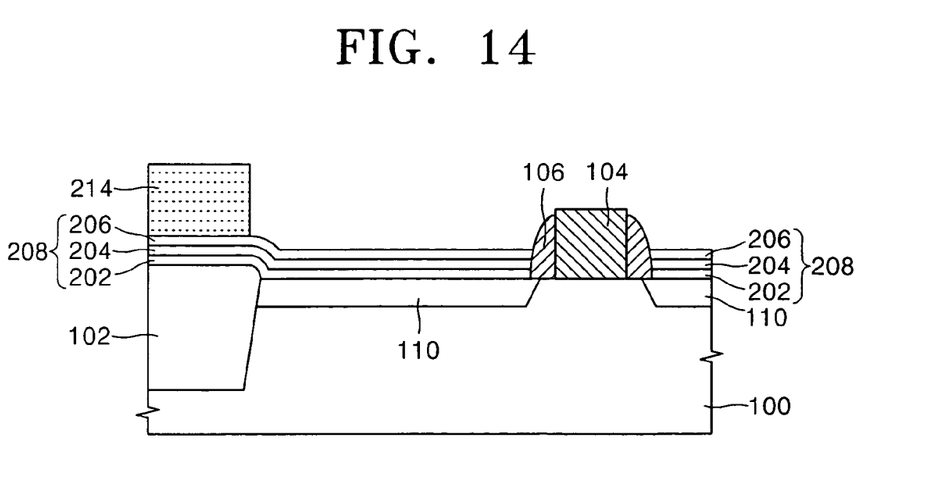
Figure 15:
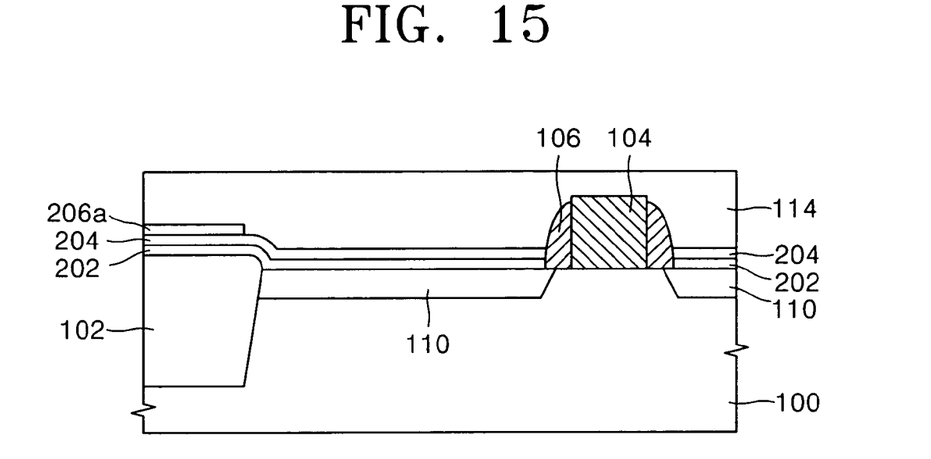
Figure 16:
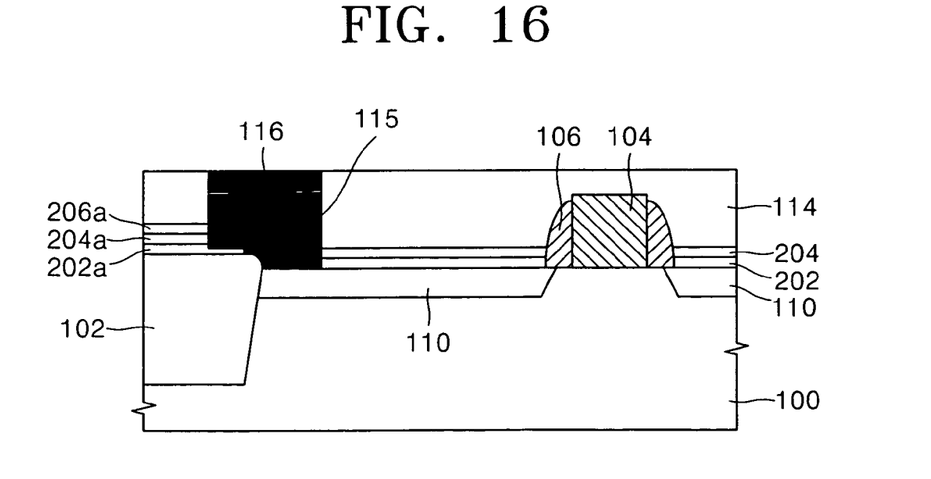

FIGS. 14 through 16 are process sectional views illustrating a semiconductor device having a local interconnection layer according to a fourth embodiment of the present invention and a method for manufacturing the same.

Referring to FIG. 14, a fourth photoresist pattern 214 for covering part of the isolation layer 102 is formed on the second etch stopper 208 according to the same method as that of FIG. 7.

Referring to FIG. 15, the second silicon nitride (Si$_3$N$_4$) layer 206 is etched using the fourth photoresist pattern 214 as an etching mask, thereby forming a second silicon nitride (Si$_3$N$_4$) layer pattern 206a for exposing the silicon oxide (SiO$_2$) layer 204. The reason the second silicon nitride (Si$_3$N$_4$) layer 206 is selectively etched is that the silicon oxide (SiO$_2$) layer 204 is used in forming a local interconnection layer (116 of FIG. 16) in a subsequent process.

The isolation layer 102 is exposed by the second silicon nitride (Si$_3$N$_4$) layer pattern 206a. Specifically, preferably, the second silicon nitride (Si$_3$N$_4$) layer pattern 206a is formed on a region that extends 0.05–0.3 µm from the end of the junction layer 110 to the inside of the isolation layer 102. Even though upper part of the isolation layer 102 is exposed by the second silicon nitride (Si$_3$N$_4$) layer 206a, the second silicon nitride (Si$_3$N$_4$) layer pattern 206a prevents the etching of the isolation layer 102. The second silicon nitride (Si$_3$N$_4$) layer pattern 206a can be easily formed by exposing upper part of the isolation layer 102. Subsequently, an interlayer dielectric (ILD) layer 114 is formed on the second silicon nitride (Si$_3$N$_4$) layer pattern 206a, the silicon oxide (SiO$_2$) layer 204, and the gate pattern 104.

Referring to FIG. 16, the ILD layer 114 is etched to form a contact hole 115 in which a local interconnection layer 116 is to be formed. The second silicon nitride (Si$_3$N$_4$) layer pattern 206a, the silicon oxide (SiO$_2$) layer 204, and the first silicon nitride (Si₃N₄) layer 202 are etched to form the contact hole 15. The second silicon nitride (Si₃N₄) layer pattern 206a and the silicon oxide (SiO₂) layer 204 in the contact hole 115 are etched by the etching process. The silicon oxide (SiO₂) layer 204 adjusts an etching rate between the second silicon nitride (Si₃N₄) layer pattern 206a and the first silicon nitride (Si₃N₄) layer 202. Part of the first silicon nitride (Si₃N₄) layer 202 is not removed, instead, it is left to serve as an etch stopper to prevent the etching of the isolation layer 102. That is, a first silicon nitride (Si₃N₄) layer pattern 202a for exposing the junction layer 110 is formed using the second silicon nitride (Si₃N₄) layer pattern 206a as an etching mask.

When forming the local interconnection layer 116, the first silicon nitride (Si₃N₄) layer pattern 202a prevents the isolation layer 102 from being etched. Thus, leakage current (A of FIG. 1) flowing from the local interconnection layer 116 to the semiconductor substrate 100 can be prevented.

The local interconnection layer 116 is formed of a conductive material filling the contact hole 115. Next, the conductive material on the surface of the ILD layer 114 is removed by performing a chemical mechanical polishing (CMP) process. As a result, the local interconnection layer 116 is formed on the contact hole 115.

According to the fourth embodiment, the first silicon nitride (Si₃N₄) layer 202 and the silicon oxide (SiO₂) layer 204 may remain on the junction layer 110 on which the local interconnection layer 116 is not formed. The first silicon nitride (Si₃N₄) layer pattern 202a, a silicon oxide (SiO₂) layer pattern 204a, and the second silicon nitride (Si₃N₄) layer pattern 206a may remain on the isolation layer 102 on which the local interconnection layer 116 is not formed. As described above, even though the first silicon nitride (Si₃N₄) layer pattern 202a, the silicon oxide (SiO₂) layer pattern 204a, and the second silicon nitride (Si₃N₄) layer pattern 206a remain on the isolation layer 102, the first silicon nitride (Si₃N₄) layer pattern 202a, the silicon oxide (SiO₂) layer pattern 204a, and the second silicon nitride (Si₃N₄) layer pattern 206a do not affect the characteristics of a semiconductor device. Further, a remaining layer or pattern is not removed, thereby reducing the time for the manufacturing process and more stably forming a semiconductor device.

As described above, in the semiconductor device having a local interconnection layer according to the present invention and the method for manufacturing the same, the etch stopper pattern having at least more than one layer for preventing the etching of the isolation layer can be included when forming the local interconnection layer, thereby preventing leakage current caused by the etching of the isolation layer, improving the electrical characteristics of a semiconductor device, and improving the yield of a process of manufacturing a semiconductor device.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A semiconductor device comprising:
an isolation layer for defining an active region of a semiconductor substrate;
a junction layer on the semiconductor substrate at both sides of a gate pattern;
an interlayer dielectric (ILD) layer covering the junction layer, the isolation layer, and the gate pattern;
a local interconnection layer in the ILD layer on the isolation layer and the junction layer; and
an etch stopper pattern having at least one layer directly on, and continuously covering, a part of the isolation layer and a part of the junction layer, wherein the local interconnection layer abuts a first portion of the etch stopper pattern covering the part of the isolation layer and abuts a second portion of the etch stopper pattern covering the part of the junction layer.

2. The semiconductor device of claim 1, wherein the etch stopper pattern is formed on a region that extends 0.05–0.3 μm, from the end of the junction layer to the inside of the isolation layer.

3. The semiconductor device of claim 1, wherein the etch stopper patterns does not cover a region that extends 0.05–0.3 μm from the end of the junction layer to the inside of the isolation layer.

4. The semiconductor device of claim 1, wherein the etch stopper pattern includes a silicon nitride (Si₃N₄) layer.

5. The semiconductor device of claim 4, wherein the thickness of the silicon nitride (Si₃N₄) layer is 300–700 Å.

6. The semiconductor device of claim 1, wherein the etch stopper pattern remains on the isolation layer on which the local interconnection layer is not formed.

7. The semiconductor device of claim 1, wherein the etch stopper pattern is comprised of a first silicon nitride (Si₃N₄) layer, a silicon oxide (SiO₂) layer, and a second silicon nitride (Si₃N₄) layer.

8. The semiconductor device of claim 7, wherein the first silicon nitride (Si₃N₄) layer and the silicon oxide (SiO₂) layer remain on the junction layer on which the local interconnection layer is not formed.

9. The semiconductor device of claim 7, wherein the first silicon nitride (Si₃N₄) layer, the silicon oxide (SiO₂) layer, and the second silicon nitride (Si₃N₄) layer remain on the isolation layer on which the local interconnection layer is not formed.

* * * * *